United States Patent [19]
Lee et al.

[11] Patent Number: 5,968,711
[45] Date of Patent: Oct. 19, 1999

[54] METHOD OF DRY ETCHING A1CU USING SIN HARD MASK

[75] Inventors: I-Ping Lee, Hsih-Chu; Erik S. Jeng, Hsinchu, both of Taiwan

[73] Assignee: Vanguard International Semiconductor Corporation, Hsin-Chu, Taiwan

[21] Appl. No.: 09/069,376

[22] Filed: Apr. 28, 1998

[51] Int. Cl.$^6$ .................................................. G03F 7/36
[52] U.S. Cl. ............................. 430/313; 430/318; 216/2; 216/77; 216/78; 438/585; 438/595
[58] Field of Search .................................. 430/313, 318; 216/2, 77, 78; 438/585, 595, 673, 687, 688

[56] References Cited

U.S. PATENT DOCUMENTS

| | | | |
|---|---|---|---|
| 4,412,885 | 11/1983 | Wang et al. | 438/713 |
| 4,511,429 | 4/1985 | Mizutani et al. | 216/77 |
| 4,915,779 | 4/1990 | Srodes et al. | 438/717 |
| 4,919,748 | 4/1990 | Bredbenner et al. | 438/656 |
| 5,211,804 | 5/1993 | Kobayashi | 216/77 |
| 5,449,639 | 9/1995 | Wei et al. | 438/636 |

*Primary Examiner*—Hoa Van Le
*Attorney, Agent, or Firm*—George O. Saile; Stephen B. Ackerman; Rosemary L. S. Pike

[57] ABSTRACT

A new method of etching AlCu or AlSiCu lines is described. Semiconductor device structures are provided in and on a semiconductor substrate. The semiconductor device structures are covered with an insulating layer. A layer of AlCu or AlSiCu is deposited overlying insulating layer. A silicon nitride or titanium nitride/silicon dioxide layer is deposited overlying the metal layer wherein a hard mask is formed. The hard mask is covered with a layer of photoresist which is exposed to actinic light wherein the hard mask prevents reflection of the actinic light from its surface. The photoresist layer is developed and patterned to form the desired photoresist mask. The hard mask is etched away where it is not covered by the photoresist mask leaving a patterned hard mask. The AlCu or AlSiCu layer and the barrier layer not covered by the patterned hard mask are etched away to form metal lines having an outwardly tapered profile.

29 Claims, 4 Drawing Sheets

METHOD OF DRY ETCHING AlCU USING SiN HARD MASK

BACKGROUND OF THE INVENTION

(1) Field of the Invention

The invention relates to a method of photolithographic etching of AlCu lines, and more particularly, to a method of photolithographic etching of AlCu lines having excellent critical dimension control and resulting in a tapered profile of the AlCu lines in the manufacture of integrated circuits.

(2) Description of the Prior Art

Due to the limitation of poor etch rate selectivity to photoresist, a thick photoresist mask is often needed during AlCu etching. As a result, the depth of focus in photolithography processes becomes even more challenging. Conventionally, a layer of titanium nitride is deposited over the AlCu layer as a barrier and anti-reflective coating layer (BARC). Conventional etchant gases are $BCl_3$ and $Cl_2$. These gases have been found to be insufficient in producing polymer on the sidewalls of the AlCu lines which would prevent undercutting during ethching.

U.S. Pat. No. 4,915,779 assigned to Motorola uses a protective oxide layer over AlCu and etches both the oxide and the AlCu layers under vacuum. U.S. Pat. No. 5,449,639 to Wei et al teaches the use of a disposable titanium nitride anti-reflective coating in etching an underlying metal layer. U.S. Pat. No. 4,412,885 to Wang et al shows a method of etching an Al layer using $BCl_3$ and $Cl_2$ with a dopant gas containing oxygen and a fluorocarbon. U.S. Pat. No. 4,511,429 to Mizutani et al teaches dry etching of Al using a hydrogen-containing gas. U.S. Pat. No. 4,919,748 to Bredbenner et al shows a method for tapered etching of metal layers using chlorine and trifluoromethane gases.

SUMMARY OF THE INVENTION

A principal object of the present invention is to provide an effective and very manufacturable method of etching AlCu or AlSiCu lines.

Another object of the present invention is to provide a method of etching AlCu or AlSiCu lines wherein photolithographic depth of focus is not a problem.

A further object of the present invention is to provide a method of etching AlCu or AlSiCu lines wherein there is no undercutting of the AlCu or AlSiCu.

Yet another object of the present invention is to provide a method of etching AlCu or AlSiCu lines wherein a tapered AlCu or AlSiCu line profile is achieved.

In accordance with the objects of this invention a new method of etching AlCu or AlSiCu lines is achieved. Semiconductor device structures are provided in and on a semiconductor substrate. The semiconductor device structures are covered with an insulating layer. A layer of AlCu or AlSiCu is deposited overlying insulating layer. A silicon nitride or titanium nitride/silicon dioxide layer is deposited overlying the metal layer wherein a hard mask is formed. The hard mask is covered with a layer of photoresist which is exposed to actinic light wherein the hard mask prevents reflection of the actinic light from its surface. The photoresist layer is developed and patterned to form the desired photoresist mask. The hard mask is etched away where it is not covered by the photoresist mask leaving a patterned hard mask. The AlCu or AlSiCu layer and the barrier layer not covered by the patterned hard mask are etched away to form metal lines having an outwardly tapered profile.

BRIEF DESCRIPTION OF THE DRAWINGS

In the accompanying drawings forming a material part of this description, there is shown:

FIGS. 1–6 schematically illustrate in cross-sectional representation a preferred embodiment of the present invention.

DESCRIPTION OF THE PREFERRED EMBODIMENTS

Figure 1:
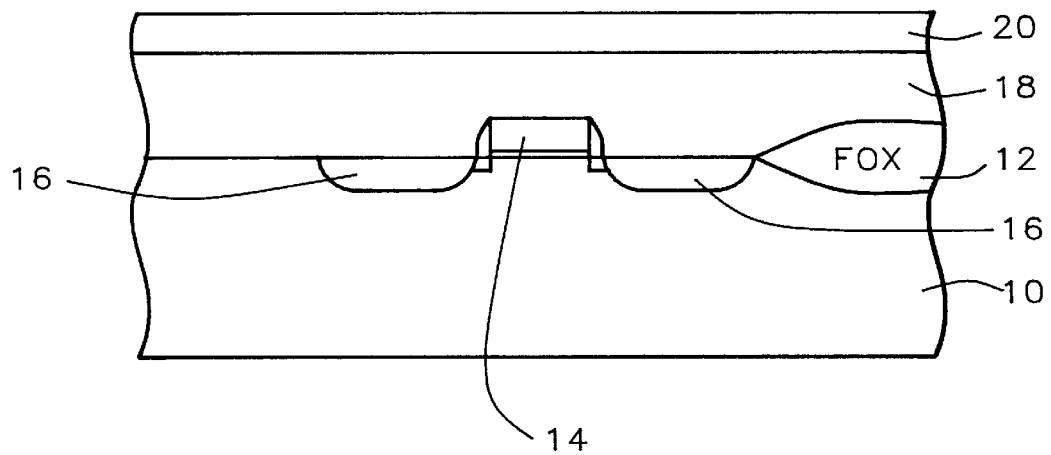

Referring now more particularly to FIG. 1, there is illustrated a portion of a partially completed integrated circuit. Semiconductor substrate 10 is preferably composed of monocrystalline silicon. Field oxide regions 12 have been formed as is conventional in the art in the semiconductor substrate 10. Semiconductor device structures, including gate electrode 14 and source and drain regions 16, are fabricated in and on the semiconductor substrate. A thick insulating layer of silicon dioxide or borophosphosilicate glass (BPSG), or the like, 18 is blanket deposited over the semiconductor device structures. Next, a barrier layer 20 is deposited over the insulating layer. This may be titanium and titanium nitride with a combined thickness of between about 500 and 1500 Angstroms.

Figure 2:
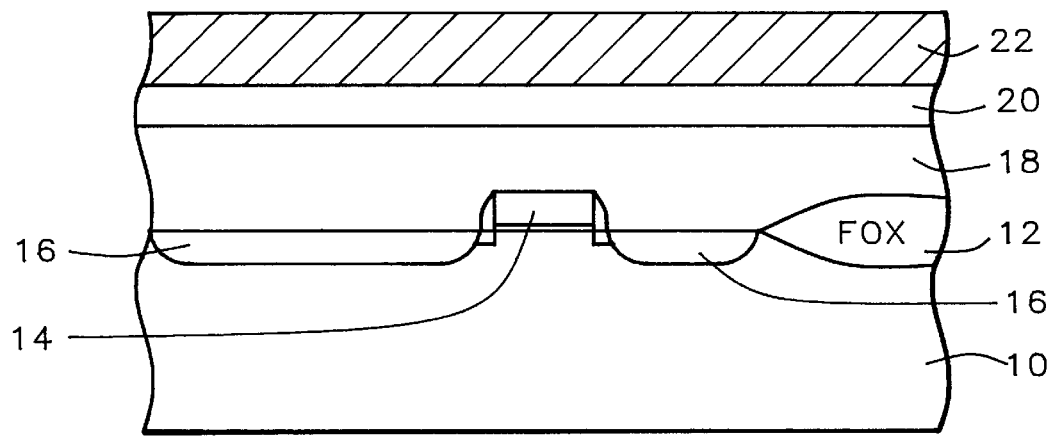

Referring now to FIG. 2, the metal layer 22 is deposited over the barrier layer 20. The metal layer comprises AlCu or AlSiCu and is deposited by sputtering to a thickness of between about 4000 and 8000 Angstroms.

Figure 3:
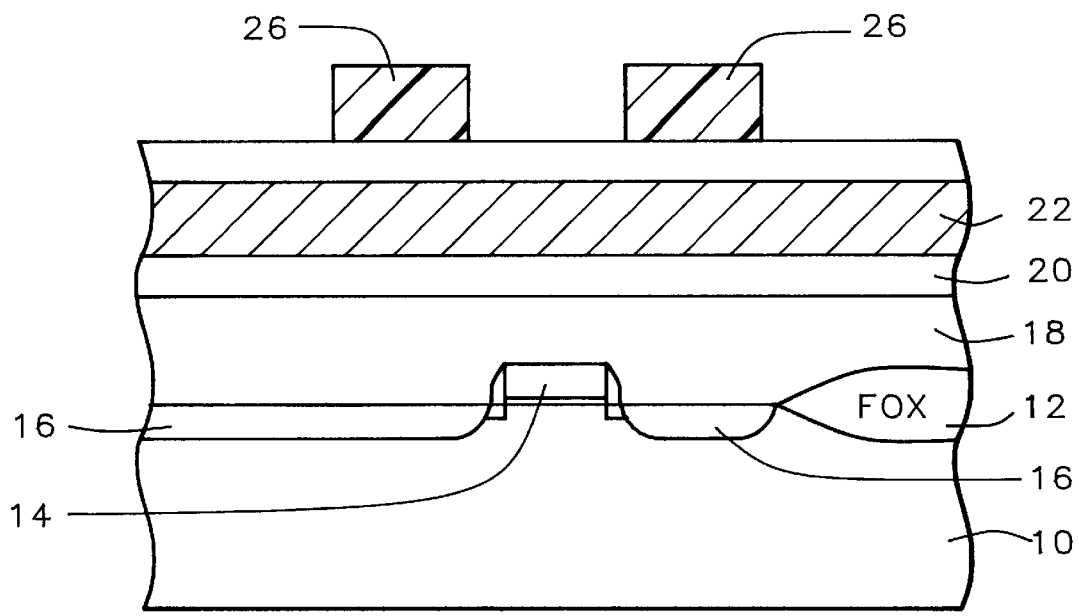

Next, the hard mask o f the present invention is formed. Referring to FIG. 3, a layer of silicon nitride or a multilayer of titanium nitride and silicon dioxide 24 is deposited over the metal layer 22 to a thickness of between about 2000 to 4000 Angstroms to form a hard mask. The hard mask is opaque to the actinic light used in photolithography so that light will not be reflected from it. The hard mask also acts as an anti-reflective coating.

A layer of photoresist is coated over the hard mask 24 and is exposed and developed to form the photoresist mask 26. In the process of the present invention, the photoresist layer has a thickness of between about 7000 and 14,000 Angstroms. Conventionally, the photoresist mask must be as thick as between about 12,000 and 18,000 Angstroms. The thinner photoresist layer of the present invention does not cause depth of focus problems during photolithography to form the photoresist mask. Using DUV photolithography instead of conventional i-line photolithography allows the use of a thinner photoresist layer.

Figure 4:
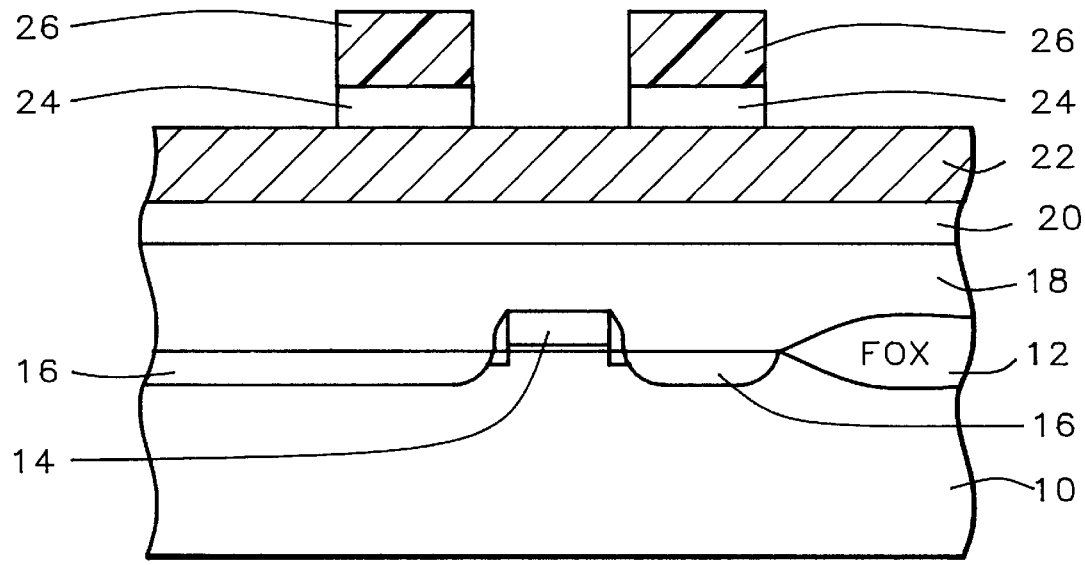

The silicon nitride layer is etched away where it is not covered by the photoresist mask 26, as illustrated in FIG. 4. The silicon nitride layer is etched using a high silicon nitride etch rate recipe, such as $SF_6$/HBr/He or $CF_4$/Ar chemistry. These etch recipes include high fluorine atom plasma which maintains a near vertical silicon nitride profile and excellent critical dimension control. For example, using $CF_4$/Ar chemistry, the gases are flowed at the rate of about 50 sccm for $CF_4$ and 500 sccm for Ar. A radio frequency of about 1300 watts and pressure of about 150 mTorr are maintained. The high Ar flow allows a low concentration of fluorine radicals to prevent sidewall undercutting of the silicon nitride. The high radio frequency power also helps the directional etching.

At this point, the photoresist mask 26 may be removed as is conventional in the art, such as by oxygen ashing. Alternatively, the photoresist mask may be left on until after the metal lines are etched. If the silicon nitride loss during metal etching can be kept within the minimum remaining thickness (typically about 500 Angstroms), the photoresist may be removed before metal etching. If the silicon nitride loss would be too high, the photoresist should be kept on as part of the etching mask.

Figure 5A:
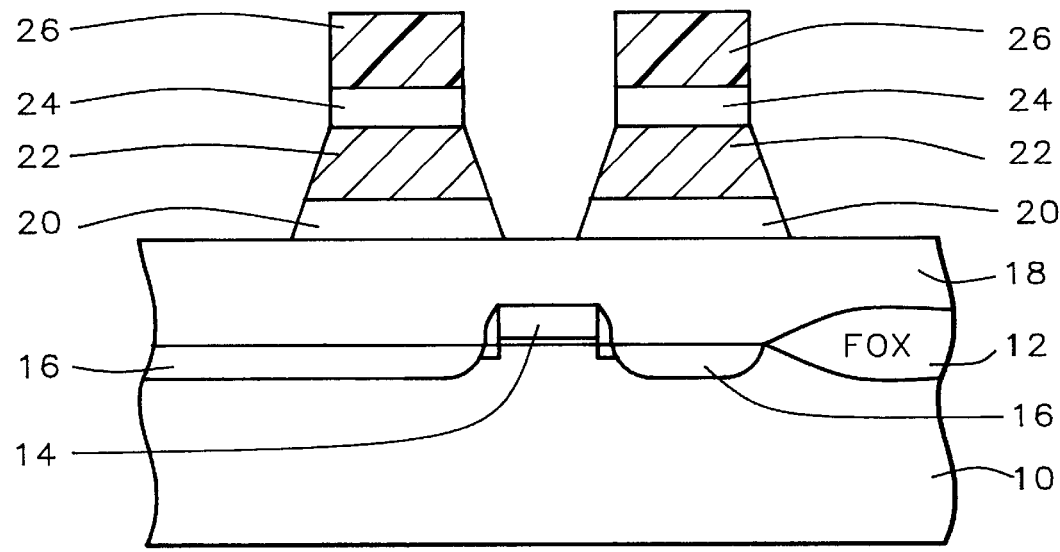
FIGS. 5A and 5B schematically illustrate in cross-sectional representation two alternatives in a preferred embodiment of the present invention.
Figure 5B:
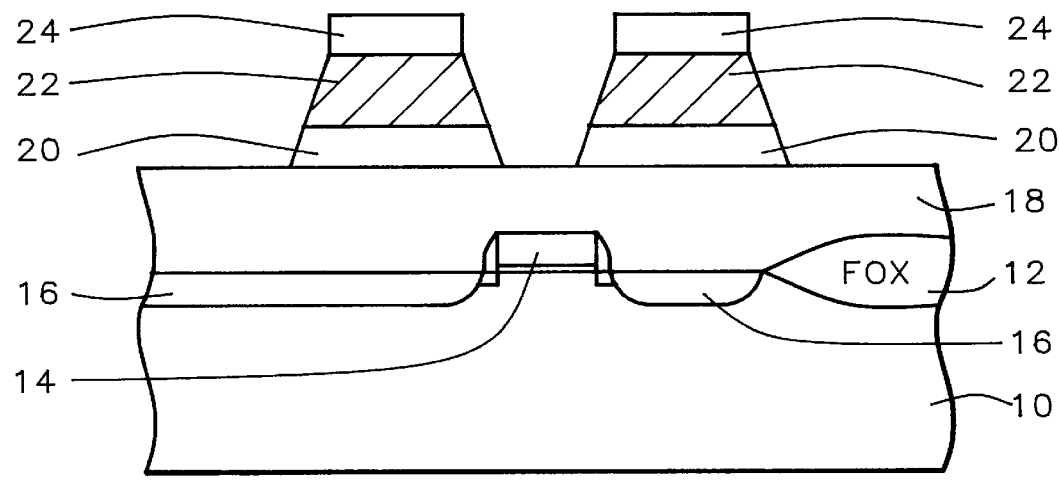

Now, the metal layer and the underlying barrier layer 20 are to be etched away where they are not covered by the hard mask, leaving metal lines 22 as shown in FIGS. 5A and 5B. An outwardly tapered profile of the metal lines is preferred with good sidewall passivation. A polymer 28 is formed on the sidewalls of the metal lines during etching to provide the sidewall passivation. This polymer prevents chlorine radicals from attacking the metal lines (so-called corrosion) during and after etching.

The tapered profile of the metal lines is achieved by increasing the operating pressure during etching and introducing a passivation gas, such as $CH_4$ or $CHF_3$. The etching recipe includes a total processing gas flow of 300 to 700 sccm, where the processing gases include Argon 15 to 45%, $CH_4$ or $CHF_3$ 1 to 10%, $BCl_3$ 20%, and $Cl_2$ 50%, at a pressure of 1.5 to 8 Pascals, which is about 11 to 62 mTorr.

FIGS. 5A and 5B illustrate the resulting metal lines 22 having the desired outwardly tapered profile. FIG. 5A illustrates the alternative in which the photoresist mask remains rn the hard mask during etching. FIG. 5B illustrates the alternative in which the photoresist mask has been removed before metal etching.

Figure 6:
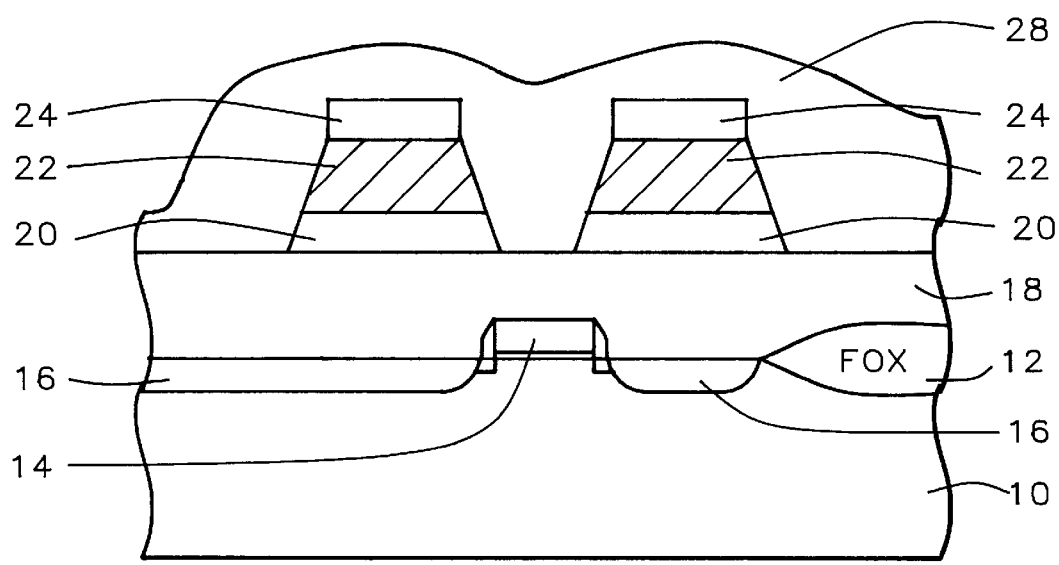

Now, the photoresist mask 26 is removed if it has not been removed already. The polymer is removed such as by oxygen ashing and wet chemical stripping. Referring to FIG. 6, an insulating layer 30 of silicon oxide or silicon nitride, or the like, is deposited over the metal lines 22. Because of the tapered profile of the metal lines, formation of voids in the gaps between the metal lines is avoided.

The process of the invention uses a silicon nitride or titanium nitride/silicon dioxide hard mask. The thinner photoresist layer allowed by the invention prevents depth of focus problems in forging the hard mask. The etching recipes used to form the hard mask have been developed and used experimentally to provide a near vertical profile of the hard mask with excellent critical dimension control. The etching recipe of the present invention used for etching the metal lines provides an outwardly tapered profile of the metal lines with no undercutting.

While the invention has been particularly shown and described with reference to the preferred embodiments thereof, it will be understood by those skilled in the art that various changes in form and details may be made without departing from the spirit and scope of the invention.

What is claimed is:

1. A method of forming outwardly tapered metal lines in the fabrication of an integrated circuit comprising:

providing semiconductor device structures in and on a semiconductor substrate;

covering said semiconductor device structures with a first insulating layer;

depositing a metal layer overlying said first insulating layer;

depositing a hard mask overlying said metal layer;

covering said hard mask with a layer of photoresist;

exposing said photoresist layer to actinic light wherein said hard mask prevents reflection of said actinic light from its surface and developing and patterning said photoresist layer to form the desired photoresist mask;

etching away said hard mask where it is not covered by said photoresist mask leaving a patterned hard mask;

etching away said metal layer and a barrier layer not covered by said patterned hard mask to form said metal lines wherein said etching results in metal lines having said outwardly tapered profile;

removing said photoresist mask; and completing said fabrication of said integrated circuit.

2. The method according to claim 1 wherein said semiconductor device structures include gate electrodes and source and drain regions.

3. The method according to claim 1 wherein said first insulating layer comprises silicon dioxide.

4. The method according to claim 1 wherein said first insulating layer comprises borophosphosilicate glass.

5. The method according to claim 1 further comprising depositing a barrier layer underlying said metal layer wherein said barrier layer comprises titanium and titanium nitride with a combined thickness of between about 500 and 1500 Angstroms.

6. The method according to claim 1 wherein said metal layer comprises AlCu having a thickness of between about 4000 and 8000 Angstroms.

7. The method according to claim 1 wherein said metal layer comprises AlSiCu having a thickness of between about 4000 and 8000 Angstroms.

8. The method according to claim 1 wherein said hard mask comprises silicon nitride having a thickness of between about 2000 and 4000 Angstroms.

9. The method according to claim 1 wherein said hard mask comprises titanium nitride and silicon dioxide having a thickness of between about 2000 and 4000 Angstroms.

10. The method according to claim 1 wherein said photoresist layer has a thickness of between about 7000 and 14,000 Angstroms.

11. The method according to claim 1 wherein said etching away of said hard mask is performed using an etching recipe having a high etch rate for said hard mask with a high fluorine atom plasma and wherein said patterned hard mask has a near vertical profile.

12. The method according to claim 11 wherein said etching recipe comprises $SF_6$/HBr/He chemistry.

13. The method according to claim 11 wherein said etching recipe comprises $CF_4$/Ar chemistry.

14. The method according to claim 1 wherein said removing said photoresist mask is done before said etching away of said metal layer.

15. The method according to claim 1 wherein said etching away of said metal layer utilizes a total gas flow of between about 300 and 700 sccm wherein the gases include Argon 15–45%, $CH_4$ 1 to 10%, $BCl_3$ 20%, and $Cl_2$ 50% and wherein the pressure is maintained at between about 11 and 62 mTorr.

16. The method according to claim 1 wherein said completing said fabrication of said integrated circuit further comprises depositing a second insulating layer over said metal lines wherein said outwardly tapered profile of said metal lines prevents the formation of voids within said second insulating layer.

17. The method according to claim 16 wherein said second insulating layer comprises silicon oxide.

18. The method according to claim 16 wherein said second insulating layer comprises silicon nitride.

19. A method of forming outwardly tapered metal lines in the fabrication of an integrated circuit comprising:

providing semiconductor device structures in and on a semiconductor substrate;

covering said semiconductor device structures with a first insulating layer;

depositing a metal layer overlying said first insulating layer;

depositing a hard mask overlying said metal layer;

covering said hard mask with a layer of photoresist;

exposing said photoresist layer to actinic light wherein said hard mask prevents reflection of said actinic light from its surface and developing and patterning said photoresist layer to form the desired photoresist mask;

etching away said hard mask where it is not covered by said photoresist mask wherein said etching comprises a high fluorine atom plasma leaving a patterned hard mask having a near vertical profile;

etching away said metal layer and a barrier layer not covered by said patterned hard mask to form said metal lines wherein said etching utilizes a total gas flow of between about 300 and 700 sccm wherein the gases include Argon 15–45%, $CH_4$ 1 to 10%, $BCl_3$ 20%, and $Cl_2$ 50% and wherein the pressure is maintained at between about 11 and 62 mTorr and wherein said etching results in metal lines having said outwardly tapered profile;

removing said photoresist mask; and completing said fabrication of said integrated circuit.

20. The method according to claim 19 wherein said semiconductor device structures include gate electrodes and source and drain regions.

21. The method according to claim 19 further comprising depositing a barrier layer underlying said metal layer wherein said barrier layer comprises titanium and titanium nitride with a combined thickness of between about 500 and 1500 Angstroms.

22. The method according to claim 19 wherein said metal layer comprises AlCu having a thickness of between about 4000 and 8000 Angstroms.

23. The method according to claim 19 wherein said metal layer comprises AlSiCu having a thickness of between about 4000 and 8000 Angstroms.

24. The method according to claim 19 wherein said hard mask comprises silicon nitride having a thickness of between about 2000 and 4000 Angstroms.

25. The method according to claim 19 wherein said hard mask comprises titanium nitride and silicon dioxide having a thickness of between about 2000 and 4000 Angstroms.

26. The method according to claim 19 wherein said high fluorine atom plasma comprises $SF_6$/HBr/He chemistry.

27. The method according to claim 19 wherein said high fluorine a tom plasma comprises $CF_4$/Ar chemistry.

28. The method according to claim 19 wherein said removing said photoresist mask is done before said etching away of said metal layer.

29. The method according to claim 19 wherein said completing said fabrication of said integrated circuit further comprises depositing a second insulating layer over said metal lines wherein said outwardly tapered profile of said metal lines prevents the formation of voids within said second insulating layer.

* * * * *

UNITED STATES PATENT AND TRADEMARK OFFICE
CERTIFICATE OF CORRECTION

PATENT NO. : 5,968,711
DATED : 10/19/99
INVENTOR(S) : I-Ping Lee, Erik S. Jeng

It is certified that error appears in the above-identified patent and that said Letters Patent is hereby corrected as shown below:

On the Cover Page, at (75), delete "I-Ping Lee, Hsih-Chu; Erik S. Jeng, Hsinchu, both of Taiwan", and replace with, --I-Ping Lee; Erik S. Jeng, both of Hsin-Chu, Taiwan--.

Signed and Sealed this

Thirtieth Day of January, 2001

Attest:

Q. TODD DICKINSON

*Attesting Officer*    *Director of Patents and Trademarks*